(12) United States Patent
Huang et al.

(10) Patent No.: US 11,342,260 B2
(45) Date of Patent: May 24, 2022

(54) POWER FLAT NO-LEAD PACKAGE

(71) Applicant: WIN Semiconductors Corp., Tao Yuan (TW)

(72) Inventors: Chih-Wen Huang, Taoyuan (TW); Jui-Chieh Chiu, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 302 days.

(21) Appl. No.: 16/601,607

(22) Filed: Oct. 15, 2019

(65) Prior Publication Data
US 2021/0111117 A1    Apr. 15, 2021

(51) Int. Cl.
| | |
|---|---|
| *H01L 23/495* | (2006.01) |
| *H01L 23/522* | (2006.01) |
| *H01L 23/00* | (2006.01) |
| H01L 23/66 | (2006.01) |

(52) U.S. Cl.
CPC .... *H01L 23/5223* (2013.01); *H01L 23/49513* (2013.01); *H01L 24/48* (2013.01); *H01L 23/66* (2013.01)

(58) Field of Classification Search
CPC ........... H01L 23/5223; H01L 23/49513; H01L 24/48; H01L 23/66; H01L 2224/73265; H01L 24/73; H01L 2224/32245; H01L 2224/49175; H01L 2224/49177; H01L 24/49; H01L 2924/19011; H01L 2223/6611; H01L 2924/30111; H01L 2924/19107; H01L 2224/48195; H01L 2224/48247; H01L 2924/19041; H01L 2924/19105; H01L 2223/6655; H01L 23/49589; H01L 23/49562; H01L 23/49575; H01L 24/45; H01L 23/3107; H01L 2924/00014; H01L 2924/00; H01L 2924/181; H01L 2924/00012; H01L 2224/48091; H01L 2924/14; H01L 2224/49171; H01L 23/49541; H01L 2224/0603; H01L 2224/04042; H01L 23/49503; H01L 24/06; H01L 2224/05553; H01L 2224/04; H01L 2224/01; H01L 2224/02; H01L 2224/0212; H01L 2224/023; H01L 2224/03; H01L 2224/04026
See application file for complete search history.

(56) References Cited

U.S. PATENT DOCUMENTS

| | | | | |
|---|---|---|---|---|
| 2003/0090877 | A1* | 5/2003 | Ochiai | .................. H01L 21/565 361/723 |
| 2005/0263863 | A1* | 12/2005 | Sasaki | ............... H01L 23/49541 257/676 |

(Continued)

FOREIGN PATENT DOCUMENTS

TW        200707697        2/2007

*Primary Examiner* — Samuel Park
(74) *Attorney, Agent, or Firm* — Winston Hsu

(57) ABSTRACT

A power flat no-lead (FN) package is provided. The power FN package includes a die paddle; a die, disposed on the die paddle, operating at a radio frequency; a first lead, disposed by a first side of the die paddle, configured to receive an input signal of the power FN package; and a capacitor, disposed on the first lead; wherein a lead width of the first lead is greater than a half of a first side length of the first side.

11 Claims, 4 Drawing Sheets

Top View

Cross Sectional View

(56) References Cited

U.S. PATENT DOCUMENTS

| | | | | |
|---|---|---|---|---|
| 2007/0029647 | A1* | 2/2007 | Torkington | H01L 23/66 |
| | | | | 257/666 |
| 2008/0265384 | A1* | 10/2008 | Dirks | H01L 23/49541 |
| | | | | 257/E23.037 |
| 2009/0243054 | A1* | 10/2009 | Yeung | H01L 23/49541 |
| | | | | 257/666 |
| 2013/0264695 | A1* | 10/2013 | Murayama | H01L 21/56 |
| | | | | 257/676 |
| 2014/0063744 | A1* | 3/2014 | Lopez | H01L 24/41 |
| | | | | 361/719 |
| 2015/0294930 | A1* | 10/2015 | Zhu | H03F 1/565 |
| | | | | 257/337 |
| 2016/0035655 | A1 | 2/2016 | Howard | |
| 2018/0364123 | A1* | 12/2018 | Vaupel | G01L 19/148 |

* cited by examiner

Top View

Cross Sectional View

POWER FLAT NO-LEAD PACKAGE

BACKGROUND OF THE INVENTION

1. Field of the Invention

The present application relates to a power FN (Flat No-Lead) package, and more particularly, to a power FN package with small size, low impedance and good IPD (Integrated Passive Device) reliability.

2. Description of the Prior Art

QFN (Quad Flat No-lead) package draws lots of interests and also demands for analog and digital integrated circuit, due to its small size, low production cost, good heat dissipation. Recently, forming high power device (e.g. power amplifier) as QFN package is demanded.

However, high power QFN package has several technical challenges. For example, as a high power package, an input impedance thereof is expected to be low (from the perspective of impedance matching), and a size thereof is also required to be as small as possible. In addition, high power device/die produces heat, which degrades IPD (Integrated Passive Device) reliability during operation.

Therefore, how to provide a power FN package with small size, low impedance and good IPD reliability is a significant objective in the field.

SUMMARY OF THE INVENTION

It is therefore a primary objective of the present application to provide a power FN package with small size, low impedance and good IPD reliability, to overcome challenges of the prior art.

An embodiment of the present application discloses a power flat no-lead (FN) package, comprising a die paddle; a die, disposed on the die paddle, operating at a radio frequency; a first lead, disposed by a first side of the die paddle, configured to receive an input signal of the power FN package; and a capacitor, disposed on the first lead; wherein a lead width of the first lead is greater than a half of a first side length of the first side.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
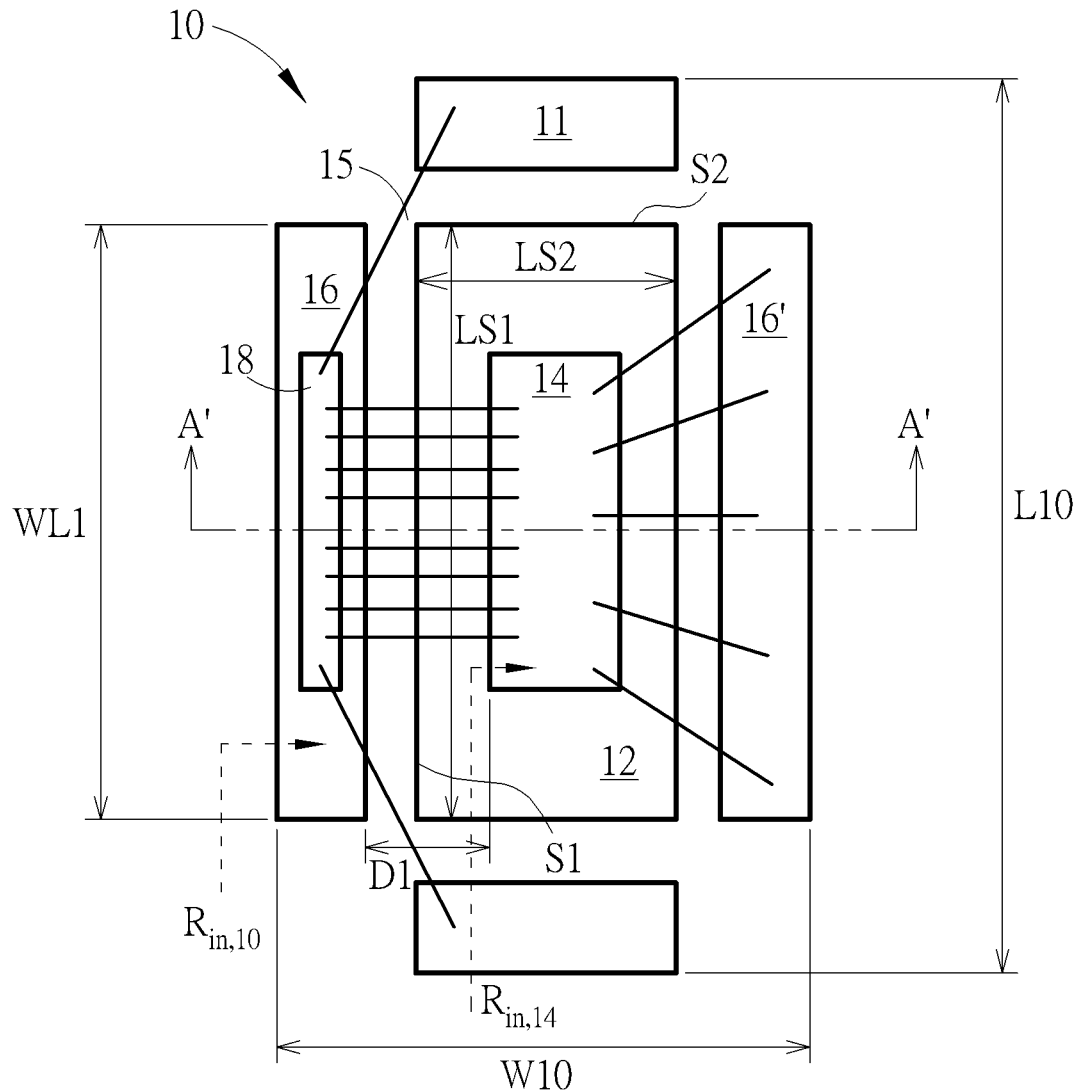
FIG. 1 is a schematic diagram of a power flat no-lead (FN) package according to an embodiment of the present application.
Figure 1:
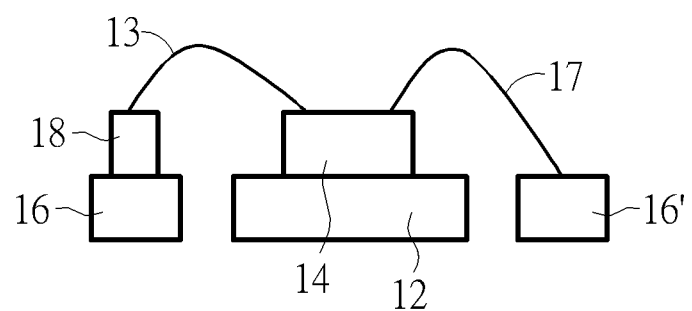

FIG. 1 is a schematic diagram of a power flat no-lead (FN) package 10 according to an embodiment of the present application. An upper portion of FIG. 1 illustrates a top view of the power FN package 10; while a lower portion of FIG. 1 illustrates a cross sectional view of the power FN package 10 through an A-A' line (show in the upper portion).

The power FN package 10 may be a power QFN (Quad Flat No-lead) package, which comprises a die paddle 12, a power die 14, a first lead 16 and a capacitor 18. The die paddle 12 is disposed in a center of the power FN package 10. The power die 14 comprises a power device. For example, the power die 14 may comprise a power transistor functioning as a power amplifier and operating at a radio frequency (e.g., 3.5 GHz). The power die 14 and/or the power FN package 10 may consume an electrical power greater than 10 Watts during their/its operation. The first lead 16 is disposed by a first side S1 of the die paddle 12. The capacitor 18 is disposed on the first lead 16, where the first lead 16 is configured to receive an input signal of the power FN package 10, and a lead 16' is configured to output an output signal of the power FN package 10.

Furthermore, the power FN package 10 may comprise die-bonding wires 13 and lead-bonding wires 15. The die-bonding wires 13 are configured to connect the capacitor 18 and the die 14; while the lead-bonding wires 15 are configured to connect the capacitor 18 and a second lead 11, where the second lead 11 is disposed by a second side S2 of the die paddle 12. The second lead 11 is electrical connected to the die 14, configured to provide a DC (direct current) bias of the power FN package 10.

In the current embodiment, the first lead 16 is disposed by a long side (i.e., the first side S1) of the die paddle 12, which means that a first side length LS1 of the first/long side S1 is greater than a second side length LS2 of the second/short side LS2 of the die paddle 12.

In the current embodiment, a lead width WL1 of the first lead 16 is preferably equal to the first side length LS1 of the first side S1, meaning that there is only one lead disposed by the die paddle 12.

Since the first lead 16 receiving the input signal is disposed on the first/long side S1 and the lead width WL1 is equal to the first side length LS1, the power FN package 10 has low input impedance and good impedance matching. Since the fact that capacitor 18 is disposed on the lead 16 away from the power die 14, the power FN package 10 would have better IPD (Integrated Passive Device) reliability. Further, the power FN package 10 may have smaller size, compared to the power FN package in the art.

In addition, the capacitor 18 is disposed in a middle of the first lead 16, and a sidewall of the capacitor 18 may be at least 200 micrometer (m) away from a sidewall of the first lead 16. Similarly, the die 14 is disposed in a middle of the die paddle 12, and a sidewall of the die 14 is at least 200 μm away from a sidewall of the die paddle 12.

Figure 2:
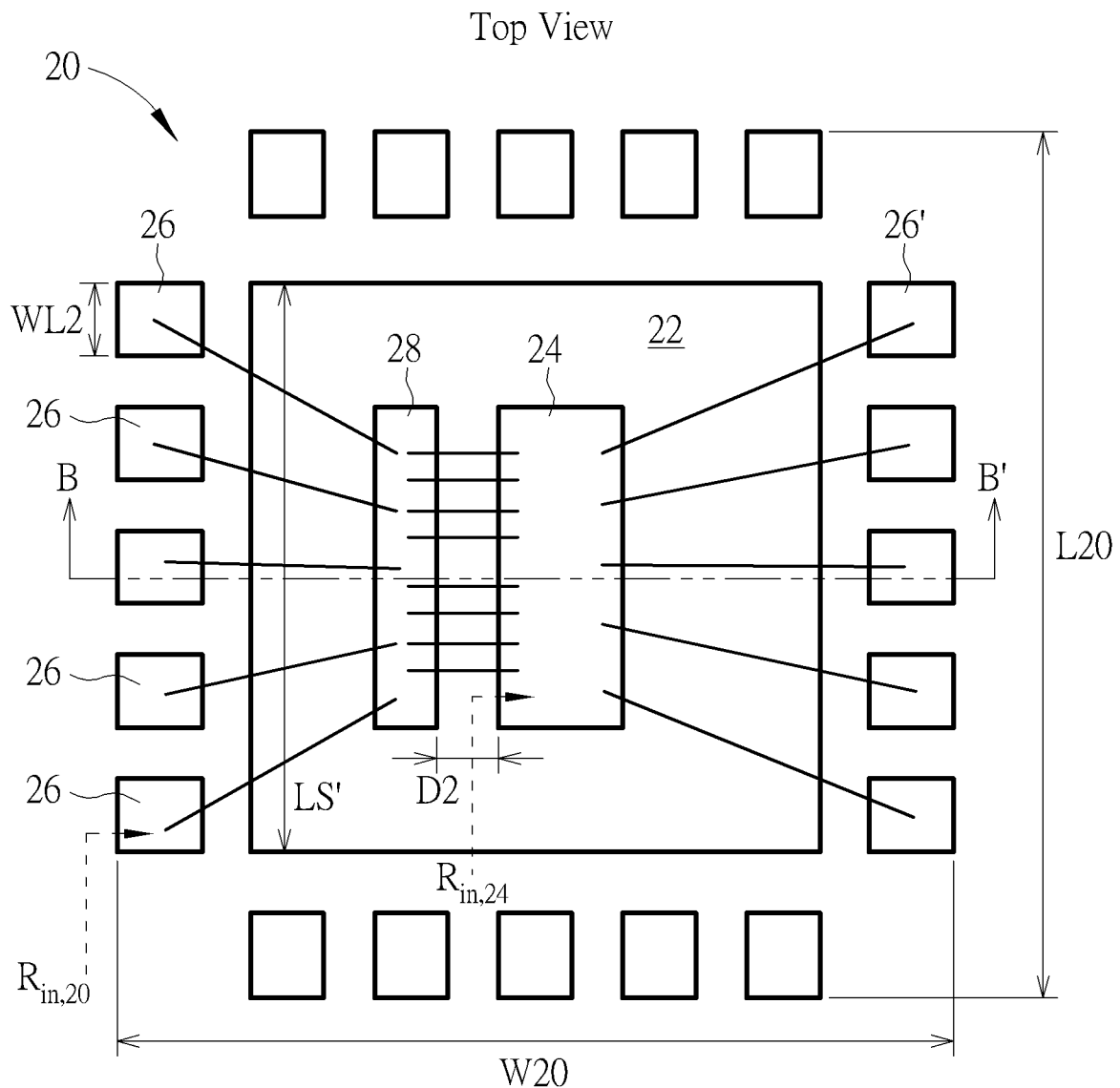
FIG. 2 is a schematic diagram of a power FN package in the art.
Figure 2:
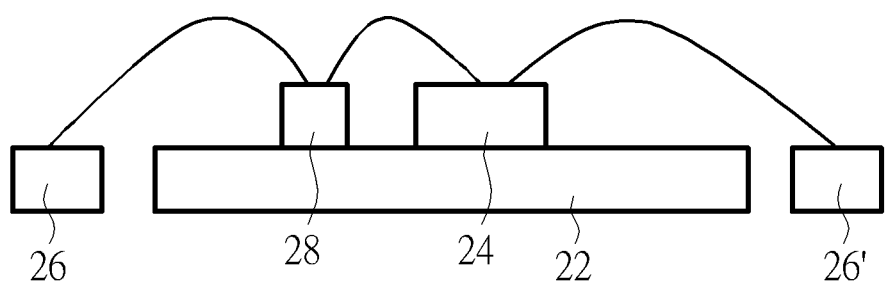

To elaborate more, FIG. 2 illustrates a power FN package 20 in the art. Similarly, an upper portion of FIG. 2 illustrates a top view of the power FN package 20; while a lower portion of FIG. 2 illustrates a cross sectional view of the power FN package 20 through a B-B' line (show in the upper portion). The power FN package 20 comprises a die paddle 22, a power die 24, a plurality of leads 26 and a capacitor 28, the first lead 26 is configured to receive an input signal of the power FN package 20, and a lead 26' is configured to output an output signal of the power FN package 20.

A first difference of the power FN package 10 versus 20 is that, the FN package 20 comprises M (e.g., M=5) separated leads 26 by a side of the die paddle 22. On the contrary, the FN package 10 comprises only one lead (i.e. the lead 16) occupying the long side thereof, so as to lower the input impedance. Specifically, taking gaps between the leads 26 into consideration, a lead width WL2 of the lead 26 should be less than 1/M of a side length LS' of the die paddle 22. Supposed that the side length LS1 of the power FN package 10 and the side length LS' of power FN package 20 are the same, the lead width WL1 would be significantly larger than the lead width WL2. Thus, a first input impedance $R_{in,10}$ (illustrated in FIG. 1) observed at/into the lead 16 would be significantly smaller than a second input impedance $R_{in,20}$ (illustrated in FIG. 2) observed at/into the lead 26, given that the input impedance observed at the lead decreases as the lead width increase. In other words, the power FN package 10 would achieve lower input impedance than the power FN package (e.g. package 20) in the art.

Further, as a power device, the power die 14/24 usually has low input impedance, which means that an input impedance $R_{in,14}/R_{in,24}$ (shown in FIG. 1/2) is small. In this case, the low input impedance $R_{in,10}$ would achieve better impedance matching, compared to the input impedance $R_{in,20}$, because $R_{in,10} < R_{in,20}$. That is, the package 10 would have better impedance matching than the package 20 in the art. Note that, better impedance matching brings broader operating bandwidth. It is expected that a first operating bandwidth of the power FN package 10 would be wider than a second operating bandwidth of the power FN package 20 (which will be shown later).

A second difference of the power FN packages 10 versus 20 is that, the capacitor 28 is disposed on the die paddle 22, while the capacitor 18 is disposed on the lead 16. Note that, the capacitor 18 is a distance (e.g., a distance D1 shown in FIG. 1) away from the power die 14, while the capacitor 28 is a distance (e.g., a distance D2 shown in FIG. 2) away from the power die 24. The distance D1, crossing over a gap between the lead 16 and the die paddle 12, may be greater than the distance D2. It means that the capacitor 18 may be far from the power die 14 (compared to the capacitor 28). Since the thermal path, via the die paddle 12 and the lead 16, from the power die 14 to the capacitor 18, is elongated by the gap, the capacitor 18 would be less affected by the heat dissipated from the power die 14. As the power FN package operates, a first capacitance of the capacitor 18 would less deviate from the designated value, compared to a second capacitor of the capacitor 28. Therefore, the power FN package 10 would have better IPD reliability.

Further, since the distance D1 covers over the gap between the lead and the die paddle while the distance D2 does not, a width W10 (shown in FIG. 1) of the package 10 should be less than a width W20 (shown in FIG. 2) of the package 20. Given a length L10 (shown in FIG. 1) of the package 10 is the same as a length L20 (shown in FIG. 2) of the package 20, a first size of the package 10 should be less than a second size of the package 20. Compared to the package 20, the package 10 would have smaller size.

Figure 3:
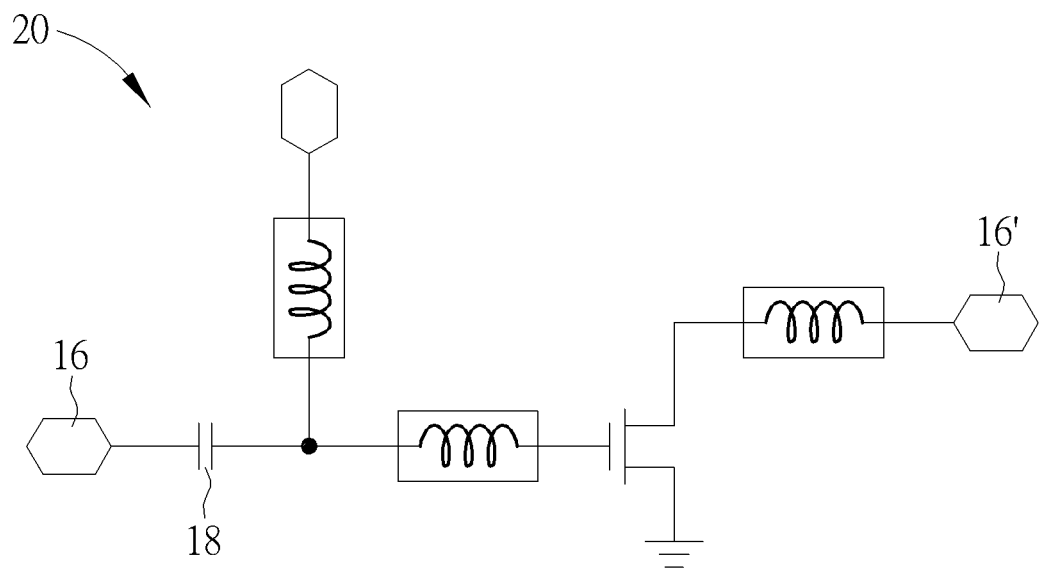
FIG. 3 is a schematic circuit diagram of the power FN package of FIG. 1.
Figure 4:
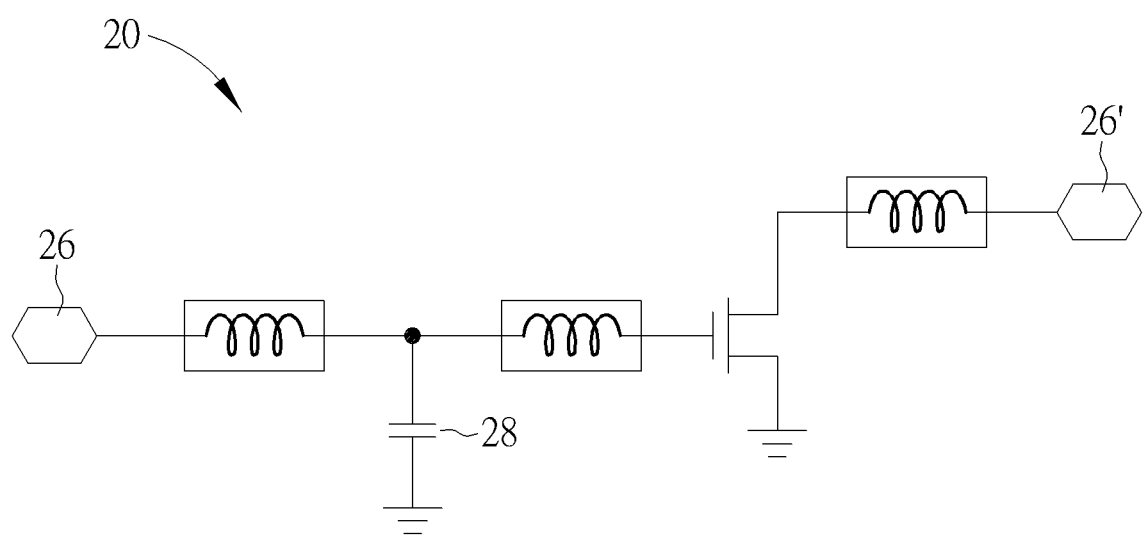
FIG. 4 is a schematic circuit diagram of the power FN package of FIG. 2.

In addition, the capacitor 18 may serve as a blocking capacitor. FIG. 3 and FIG. 4 illustrate schematic circuit diagrams of the packages 10 and 20, respectively, assuming the power die 14/24 comprises a power transistor. For the package 20, an external blocking capacitor is required to block out noise and/or DC (direct current) signal component. On the other hand, in the package 10, the blocking capacitor is incorporated as the capacitor 18. No external blocking capacitor is needed for the package 10. Hence, a circuit area (on a PCB (Printed Circuit Board)) utilizing the package 10 can be further spared.

In short, the power FN package 10 has advantages of low input impedance, good impedance matching, wide operating bandwidth, good IPD reliability and small size, over the power FN package 20 in the art. Further, utilizing the package 10 can further spare the circuit area on the PCB.

Figure 5:
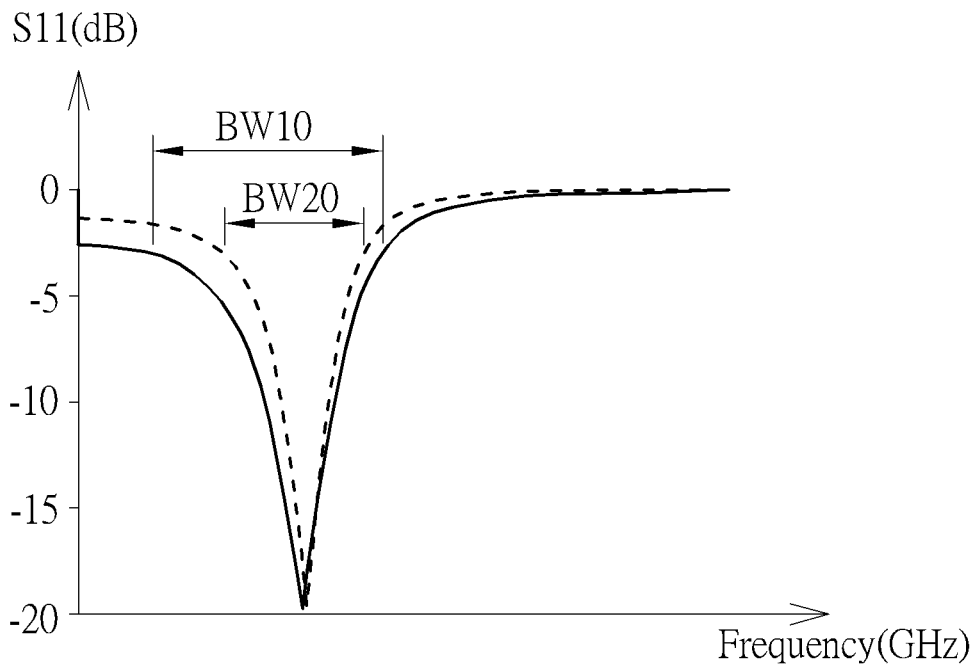
FIG. 5 is a schematic diagram of frequency response of the power FN packages in FIG. 1 and FIG. 2.

FIG. 5 is a schematic diagram of frequency response of the power FN packages 10 and 20 operating at 3.5 GHz. In FIG. 5, a solid line represents the parameter S11 of the power FN package 10 and a dotted line represents the parameter S11 of the power FN package 20. As can be seen from FIG. 5, the power FN package 10 owns an operating bandwidth BW10, which is wider than an operating bandwidth BW20 of the package 20.

Figure 6:
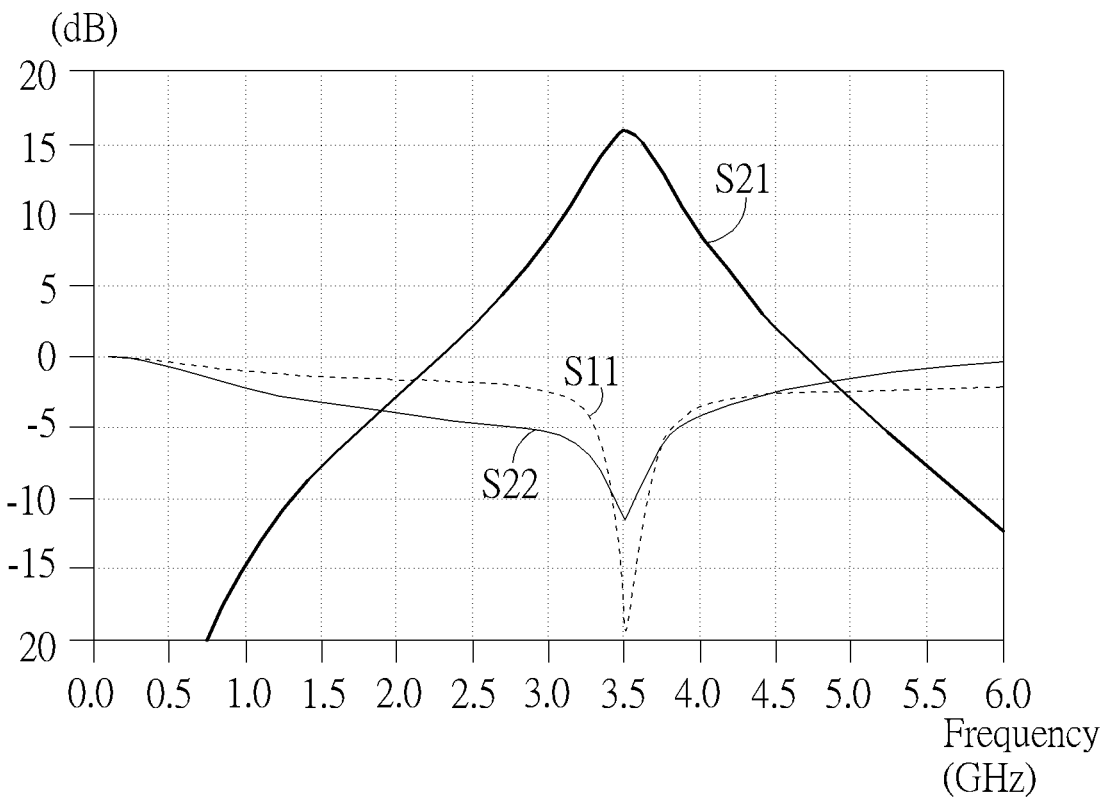
FIG. 6 is a schematic diagram of frequency response of the power FN packages in FIG. 1.

FIG. 6 is a schematic diagram of frequency response of the power FN packages 10. In FIG. 6, the parameters S11, S21, and S22 are illustrated. As can be seen from FIG. 6, the power FN package 10 may achieve a 15.8 dB gain in terms of the parameter S21 at 3.5 GHz, with an operating bandwidth substantially of 500 MHz.

Notably, the embodiments stated in the above are utilized for illustrating the concept of the present application. Those skilled in the art may make modifications and alterations accordingly, and not limited herein. For example, in FIG. 1, the lead width WL1 is preferably equal to the first side length LS1, but not limited thereto. In order to obtain better impedance matching, the input impedance of the power FN package is required to be lowered, and the lead width of the lead (especially the one receiving the input signal of the package) is required to be sufficiently wide. It is suggested that the lead width (e.g., the lead width WL1) is greater than a half of the side length (e.g., the side length LS1) of the side (e.g., the side S1) by which the lead (e.g., the lead 16) is disposed. Hence, as long as the lead width (WL1) is greater than the half of the side length (50%×LS1), the requirement of the present application is satisfied, which is within the scope of the present application.

In summary, by disposing the lead with sufficient lead width, the power FN package of the present application has advantages of low input impedance, good impedance matching and wide operating bandwidth over the prior art; by disposing the capacitor on the lead with sufficient lead width, the power FN package of the present application has advantages of good IPD reliability and small size over the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power flat no-lead (FN) package, comprising:
    a die paddle;
    a die, disposed on the die paddle, operating at a radio frequency;
    a first lead, disposed by a first side of the die paddle, configured to receive an input signal of the power FN package, wherein the first lead is a rectangle and is spaced apart from the die paddle without being in contact with the die paddle; and
    a capacitor, disposed on the first lead, wherein the capacitor is completely disposed on and completely overlapped with the first lead;
    wherein a lead width of the first lead is greater than a half of a first side length of the first side.

2. The power FN package of claim 1, wherein the power FN package is a power Quad Flat No-lead (QFN) package.

3. The power FN package of claim 1, wherein an operation of the power FN package consumes at least 10 Watts.

4. The power FN package of claim 1, wherein the first side length is greater than a second side length of a second side of the of the die paddle.

5. The power FN package of claim 1, wherein the lead width is equal to the first side length.

6. The power FN package of claim 1, comprising:
a plurality of die-bonding wires, configured to connect the capacitor and the die.

7. The power FN package of claim 1, comprising:
at least a lead-bonding wire, configured to connect the capacitor and a second lead;
wherein the second lead is disposed by a second side of the die paddle.

8. The power FN package of claim 1, wherein the capacitor is disposed in a middle of the first lead, and a sidewall of the capacitor is at least 200 micrometer (μm) away from a sidewall of the first lead.

9. The power FN package of claim 1, wherein the die is disposed in a middle of the die paddle, and a sidewall of the die is at least 200 micrometer (μm) away from a sidewall of the die paddle.

10. The power FN package of claim 1, further comprising:
a second lead, disposed by a second side of the die paddle, coupled to the die, configured to provide a DC bias of the power FN package; and
a third lead, disposed by a third side of the die paddle, configured to output an output signal of the power FN package.

11. The power FN package of claim 1, wherein the first lead is an input terminal of the power FN package.

* * * * *